(12) United States Patent
Itoh

(10) Patent No.: US 6,856,170 B2
(45) Date of Patent: Feb. 15, 2005

(54) CLOCK SIGNAL TRANSMISSION CIRCUIT

(75) Inventor: Niichi Itoh, Tokyo (JP)

(73) Assignee: Renesas Technology Corp., Tokyo (JP)

(*) Notice: Subject to any disclaimer, the term of this patent is extended or adjusted under 35 U.S.C. 154(b) by 98 days.

(21) Appl. No.: 10/442,090

(22) Filed: May 21, 2003

(65) Prior Publication Data

US 2004/0095165 A1 May 20, 2004

(30) Foreign Application Priority Data

Nov. 18, 2002 (JP) ........................................ 2002-333236

(51) Int. Cl.[7] .............................................. H03K 19/094
(52) U.S. Cl. .............................. 326/93; 326/41; 257/59; 327/277; 327/284; 375/371; 375/373
(58) Field of Search ....................... 326/93, 41; 257/59; 327/277, 284; 375/371, 373

(56) References Cited

U.S. PATENT DOCUMENTS

| | | | | |
|---|---|---|---|---|
| 5,559,459 A | * | 9/1996 | Back et al. ..................... | 326/93 |
| 5,892,384 A | * | 4/1999 | Yamada et al. ............. | 327/277 |
| 6,127,844 A | * | 10/2000 | Cliff et al. ..................... | 326/93 |
| 6,417,521 B2 | * | 7/2002 | Inukai .......................... | 257/59 |
| 6,785,354 B1 | * | 8/2004 | Dietrich ...................... | 375/373 |

FOREIGN PATENT DOCUMENTS

JP    10-209284    8/1998

* cited by examiner

*Primary Examiner*—Michael Tokar
*Assistant Examiner*—Lam T. Mai
(74) *Attorney, Agent, or Firm*—Oblon, Spivak, McClelland, Maier & Neustadt, P.C.

(57) ABSTRACT

A clock generator (10a) outputs either a first clock signal or a second clock signal. The second clock signal is higher in frequency than the first clock signal. Under control of a control signal (CNTL1), when the first clock signal and the second clock signal are outputted from the clock generator (10a), a selector (81a) transmits the first and second clock signals to a clock transmission line (42) and to a clock transmission line (41), respectively. The clock transmission line (41) is greater in linewidth than the clock transmission line (42). Under control of the control signal (CNTL1), a selector (82a) connects either the clock transmission line (41) or the clock transmission line (42) to the outside.

10 Claims, 5 Drawing Sheets

CLOCK SIGNAL TRANSMISSION CIRCUIT

BACKGROUND OF THE INVENTION

1. Field of the Invention

The present invention relates to a technique for transmitting a clock signal.

2. Description of the Background Art

In designing an integrated circuit having a plurality of modes of operating frequencies, the assumed maximum operating frequency may be such that it is at an acceptable level for putting the integrated circuit into operation. In the integrated circuit, a demand for high speed operation grows as a frequency of a clock signal, depending on which the integrated circuit operates, becomes higher. The result is an increase in power consumption of the integrated circuit. Accordingly, when the frequency of a clock signal provided to the integrated circuit is low, though the configuration of the integrated circuit is responsive to high speed operation, an unnecessarily large amount of power may be consumed.

In light of this, a technique for transmitting a clock signal using a plurality of buffers has been suggested, as disclosed in Japanese Patent Application Laid-Open No. 10-209284 (1998), for example. According to this technique, the plurality of buffers are selectively put into operation on the basis of a frequency of a clock signal applied thereto.

In response to the case of transmission of a clock signal having a high frequency, an interconnect line for carrying a clock signal (hereinafter referred to as a "clock transmission line") has a large linewidth for reduction in line resistance. In order for the transmission line to resist crosstalk noise from another interconnect line, it is preferable to independently provide a shielding line around the transmission line, and to apply a fixed potential to this shielding line.

On the other hand, for reduction in power consumption, a driving capability of a buffer which operates in response to a low-frequency clock signal is kept low. Due to this, when a low-frequency clock signal is provided from this buffer to the transmission line, an unnecessary increase in line capacitance is caused, leading to wasted power consumption.

SUMMARY OF THE INVENTION

It is therefore an object of the present invention to provide a technique for transmitting a clock signal to be applied according to the frequency of the clock signal, while suitably controlling operation speed and power consumption.

The present invention is intended for a clock signal transmission circuit selectively receiving a first clock signal and a second clock signal. The first clock signal has a first frequency and the second clock signal has a second frequency higher than the first frequency. The clock signal transmission circuit includes a first clock transmission line for carrying the first clock signal, and a second clock transmission line for carrying the second clock signal. The second clock transmission line is greater in linewidth than the first clock transmission line. No transmission of the second clock signal occurs through the first clock transmission line. No transmission of the first clock signal occurs through the second clock transmission line.

The first clock signal can be transmitted with no waste of power. The second clock signal can be transmitted with no increase in waveform distortion.

These and other objects, features, aspects and advantages of the present invention will become more apparent from the following detailed description of the present invention when taken in conjunction with the accompanying drawings.

DESCRIPTION OF THE PREFERRED EMBODIMENTS

For transmission of a clock signal, a clock transmission line, and an inverter interposed therein as an intermediary for transmission of the clock signal, are generally employed. In view of this, in the present invention, transmission of a signal as a result of the inverse of the clock signal, and transmission of two transitions of the clock signal in the opposite directions (namely, up-to-down and down-to-up directions), are also referred to as transmission of the clock signal.

First Preferred Embodiment

Figure 1:
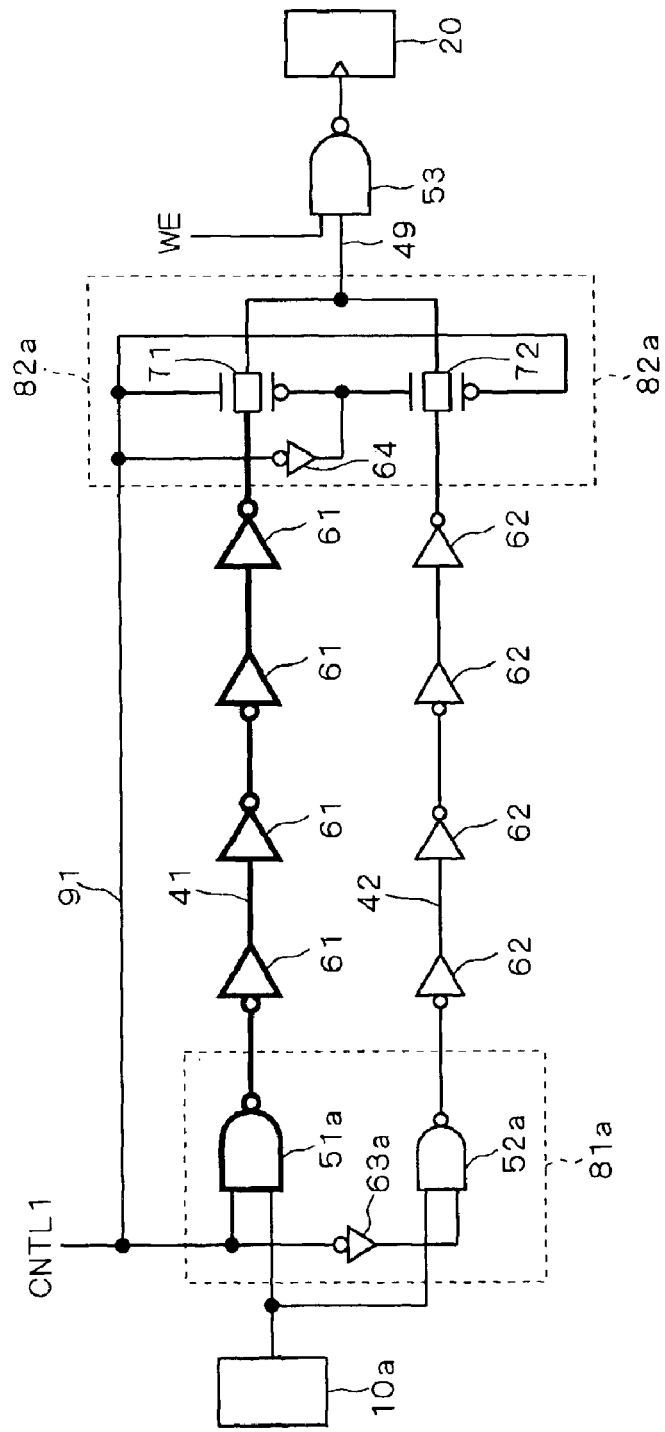
FIG. 1 is a circuit diagram illustrating a configuration according to a first preferred embodiment of the present invention.

FIG. 1 is a circuit diagram illustrating the configuration according to the first preferred embodiment of the present invention. A clock generator 10a selectively outputs a first clock signal having a first frequency, and a second clock signal having a second frequency. The second frequency is set to be higher than the first frequency. Either the first or second clock signal outputted from the clock generator 10a is provided to a clock output line 49 as an output clock.

Together with a write enable signal WE, the clock signal provided to the clock output line 49 is further provided to an NAND gate 53. The output of the NAND gate 53 is provided to a clock input terminal of a logic element 20, whereby write operation of the logic element 20 is controlled.

A clock signal transmission circuit comprises clock transmission lines 41 and 42. By a selector 81a to be described later, the first clock signal is transmitted to the clock transmission line 42, while no transmission of the second clock signal occurs thereto. Conversely, the second clock signal is transmitted to the clock transmission line 41, while no transmission of the first clock signal occurs thereto. The clock transmission line 41 has a linewidth greater than that of the clock transmission line 42, as indicated in FIG. 1 by the thicker drawing line for the clock transmission line 41 than that for the clock transmission line 42.

For transmission of the first clock signal having a lower frequency, the clock transmission line 42 smaller in linewidth and line capacitance than the clock transmission line 41 is employed, rather than the clock transmission line 41 having a larger linewidth and an unnecessarily large line capacitance. As a result, the first clock signal can be transmitted with no waste of power. Conversely, for transmission of the second clock signal having a higher frequency, the clock transmission line 41 greater in linewidth than the clock transmission line 42 is employed, rather than the clock transmission line 42 having a smaller linewidth and a higher line resistance. As a result, the second clock signal can be transmitted with no increase in waveform distortion.

The clock signal transmission circuit further comprises junction inverters 62 interposed in the clock transmission line 42 as intermediaries for transmission of the first clock signal, and junction inverters 61 interposed in the clock transmission line 41 as intermediaries for transmission of the second clock signal. The junction inverters 62 and 61 respectively act as buffers against the first and second clock signals. As the second clock signal is higher in frequency than the first clock signal, the junction inverter 61 is preferably greater in current driving capability than the junction inverter 62. Such difference in current driving capability is indicated in FIG. 1 by the thicker drawing line for the junction inverter 61 than that for the junction inverter 62.

The clock signal transmission circuit further comprises the selector 81a. The output of the clock generator 10a and a control signal CNTL1 are inputted to the selector 81a. The selector 81a then outputs the first and second clock signals to the clock transmission lines 42 and 41, respectively. When the first and second signal clocks are outputted from the clock generator 10a, the control signal CNTL1 is at binary logics "L" and "H", respectively. By way of example, the control signal CNTL1 may be inputted from the outside to the clock generator 10a, to determine which of the first or the second clock signal should be outputted from the clock generator 10a. As another example, on the basis of which of the first or the second clock signal is to be outputted from the clock generator 10a, the control signal CNTL1 is generated by the clock generator 10a.

The selector 81a includes logic gates 51a and 52a, for example. The logic gate 51a provides the inverse of a logical product, of the output of the clock generator 10a and the control signal CNTL1, to one end of the clock transmission line 41. The logic gate 52a provides the inverse of a logical product, of the output of the clock generator 10a and the inverse of the control signal CNTL1, to one end of the clock transmission line 42. The selector 81a may further include an inverter 63a for outputting the inverse of the control signal CNTL1.

When the control signal CNTL1 is at the logic "L", the clock generator 10a outputs the first clock signal. In response, the logic gate 52a outputs the inverse of the first clock signal to the clock transmission line 42. On the other hand, the logic gate 51a outputs a potential corresponding to the logic "H", whereby the potential of the clock transmission line 41 is fixed.

When the control signal CNTL1 is at the logic "H", the clock generator 10a outputs the second clock signal. In response, the logic gate 51a outputs the inverse of the second clock signal to the clock transmission line 41. On the other hand, the logic gate 52a outputs a potential corresponding to the logic "L", whereby the potential of the clock transmission line 42 is fixed.

As described, when the first clock signal is outputted from the clock generator 10a, it is transmitted to the clock transmission line 42, not to the clock transmission line 41. Conversely, when the second clock signal is outputted from the clock generator 10a, it is transmitted to the clock transmission line 41, not to the clock transmission line 42.

In order for the selector 81a to become operative in the foregoing manner, the logic gate 51a is preferably greater in current driving capability than the logic gate 52a. Such difference in current driving capability is indicated in FIG. 1 by the thicker drawing line for the logic gate 51a than that for the logic gate 52a.

The clock signal transmission circuit further comprises a selector 82a. In order to give the control signal CNTL1 to the selector 82a, a control line 91 is provided for connecting the selectors 81a and 82a. On the basis of the value of the control signal CNTL1, the selector 82a outputs the clock signal, provided either to the clock transmission line 41 or to the clock transmission line 42, as an output clock to the clock output line 49.

The selector 82a includes transmission gates 71 and 72, and an inverter 64, for example. The inverter 64 outputs the inverse of the control signal CNTL1. The transmission gates 71 and 72 each have a parallel connection of an NMOS transistor and a PMOS transistor. The control signal CNTL1 is provided to a gate of the NMOS transistor of the transmission gate 71, and to a gate of the PMOS transistor of the transmission gate 72. The inverse of the control signal CNTL1 is provided to a gate of the PMOS transistor of the transmission gate 71, and to a gate of the NMOS transistor of the transmission gate 72.

One end of the transmission gate 71 is connected to the clock transmission line 41, and one end of the transmission gate 72 is connected to the clock transmission line 42. Another end of the transmission gate 71 and another end of the transmission gate 72 are both connected to the clock output line 49. Accordingly, when the logic "H" enters the control signal CNTL1, the clock transmission line 41 and the clock output line 49 are conductively connected. When the logic "L" enters the control signal CNTL1, the clock transmission line 42 and the clock output line 49 are conductively connected. As a result, both the first and second clock signals, regardless of which one is to be outputted from the clock generator 10a, are provided to the NAND gate 53.

The first clock signal is transmitted to the clock transmission line 42, while no transmission of the second clock signal occurs thereto. Conversely, the second clock signal is transmitted through the clock transmission line 41, while no transmission of the first clock signal occurs thereto. When the first clock signal passes through the clock transmission line 42, the potential of the clock transmission line 41 is fixed. When the second clock signal passes through the clock transmission line 41, the potential of the clock transmission line 42 is fixed. Therefore, the clock transmission line 41 bearing a fixed potential is operative to serve as a shielding line against the clock transmission line 42 for carrying the first clock signal. The clock transmission line 42 bearing a fixed potential is operative to serve as a shielding line against the clock transmission line 41 for carrying the second clock signal.

Regardless of which of the first or the second clock signal is to be outputted from the clock generator 10a, the control signal CNTL1 is fixed at the logic "L" or "H", respectively, whereby the potential of the control line 91 is further fixed. Therefore, the control line 91 can also be operative to act as a shielding line.

Figure 2:
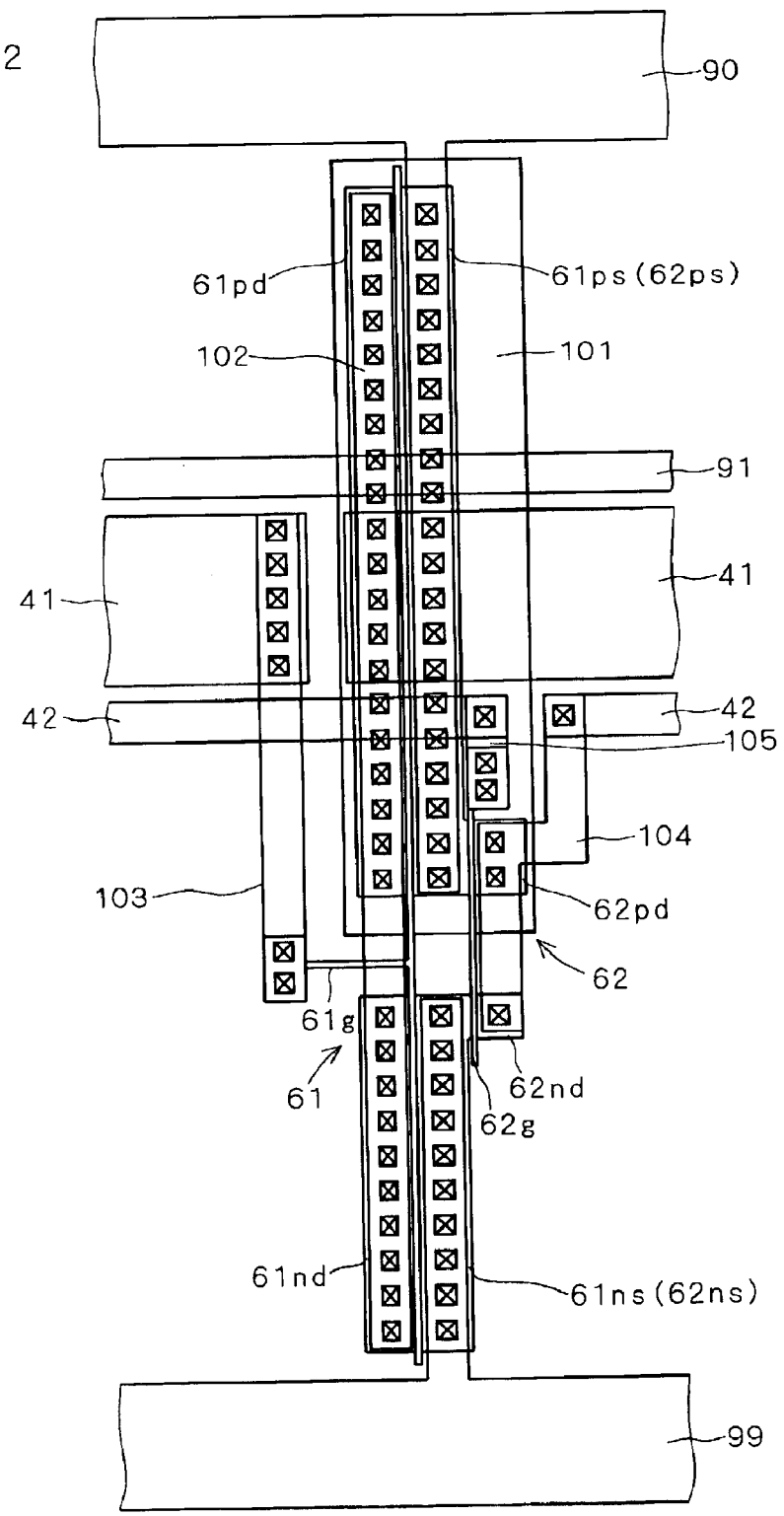
FIG. 2 is a plan view illustrating an interconnection according to the first preferred embodiment of the present invention.

FIG. 2 is a plan view schematically illustrating the interconnection around the junction inverters 61 and 62. By way of example, an upper surface of a semiconductor substrate is shown to be of p-type. The junction inverters 61 and 62 each have a series connection of a PMOS transistor and an NMOS transistor. A polysilicon gate 61g serving as a common gate of the NMOS and PMOS transistors for constituting the junction inverter 61, and a polysilicon gate 62g serving as a common gate of the NMOS and PMOS transistors for constituting the junction inverter 62, both extend in a vertical direction in the plane of the drawing.

N-type impurity layers 61nd and 61ns as a pair respectively act as a drain and a source of the NMOS transistor for constituting the junction inverter 61. The n-type impurity layers 61nd and 61ns extend in the vertical direction in the plane of the drawing, partially holding the polysilicon gate 61g therebetween in plan view.

N-type impurity layers 62nd and 62ns as a pair respectively act as a drain and a source of the NMOS transistor for constituting the junction inverter 62. The n-type impurity layers 62nd and 62ns extend in the vertical direction in the plane of the drawing, partially holding the polysilicon gate 62g therebetween in plan view. The n-type impurity layer 62ns also functions as the n-type impurity layer 61ns.

P-type impurity layers 61pd and 61ps as a pair respectively act as a drain and a source of the PMOS transistor for constituting the junction inverter 61. The p-type impurity layers 61pd and 61ps extend in the vertical direction in the plane of the drawing, partially holding the polysilicon gate 61g therebetween in plan view.

P-type impurity layers 62pd and 62ps as a pair respectively act as a drain and a source of the PMOS transistor for constituting the junction inverter 62. The p-type impurity layers 62pd and 62ps extend in the vertical direction in the plane of the drawing, partially holding the polysilicon gate 62g therebetween in plan view. The p-type impurity layer 62ps also functions as the n-type impurity layer 61ps.

Those two PMOS transistors for respectively constituting the junction inverters 61 and 62 are formed in an n-well region, which is shown to be surrounded by an insulating region 101 in plan view.

The current driving capability of the junction inverter 61 should be greater than that of the junction inverter 62. Therefore, the n-type impurity layer 61nd and the p-type impurity layer 61pd extend longer than the n-type impurity layer 62nd and the p-type impurity layer 62pd, respectively.

As upper interconnects, the control line 91, and the clock transmission lines 41 and 42 are arranged in descending order, extending in a horizontal direction in the plane of the drawing. These upper interconnects may be metal lines, for example.

Lower interconnects are formed between the upper interconnects, and the n-type impurity layers 61nd, 61ns (62ns), 62nd, the p-type impurity layers 61pd, 61ps (62ps), 62pd and the polysilicon gates 61g, 62d. The lower interconnects may be metal lines, for example.

As lower interconnects, power source lines 90 and 99 are arranged in the horizontal direction in the plane of the drawing. The power source line 99 applies a potential, corresponding to the logic "L" such as a ground potential GND, to the junction inverters 61 and 62. The power source line 90 applies a potential, corresponding to the logic "H" such as a positive potential VDD, to the junction inverters 61 and 62.

Interconnect lines 102 through 105 are further provided as lower interconnects. The interconnect line 102 connects the clock transmission line 41 on the side for receiving the output of the junction inverter 61 to the n-type impurity layer 61nd and to the p-type impurity layer 61pd. The interconnect line 103 connects the clock transmission line 41 on the input side to the junction inverter 61 to the polysilicon gate 61g. The interconnect line 104 connects the clock transmission line 42 on the side for receiving the output of the junction inverter 62 to the n-type impurity layer 62nd and to the p-type impurity layer 62pd. The interconnect line 105 connects the clock transmission line 42 on the input side to the junction inverter 62 to the polysilicon gate 62g.

In FIG. 2, in order to avoid complication, no hidden line is illustrated even in the region where the upper interconnect, the lower interconnect, and the polysilicon gate overlap each other. Further, when a boundary line defined on the semiconductor substrate or the impurity layer is concealed by the polysilicon gate, this boundary line is not illustrated in FIG. 2. Still further, connection established between the components which are different from each other in height (namely, different in distance from the semiconductor substrate) is indicated by crosses surrounded by squares.

The junction inverters 61 and 62 act as intermediaries of the clock transmission lines 41 and 42, respectively. In contrast, the control line 91 is shown to have no connection to any other component of FIG. 2.

As understood from the foregoing, the clock transmission line 41 is interposed between the control line 91 and the clock transmission line 42. When the second clock signal passes through the clock transmission line 41, both the clock transmission line 42 and the control line 91 bear fixed potentials. As a result, the clock transmission line 41 is shielded from both sides thereof, whereby no shielding line should be provided independently.

Alternatively, the clock transmission line 42 may be interposed between the control line 91 and the clock transmission line 41. In this case, when the first clock signal passes through the clock transmission line 42, the clock transmission line 42 is shielded from both sides thereof.

Figure 3:
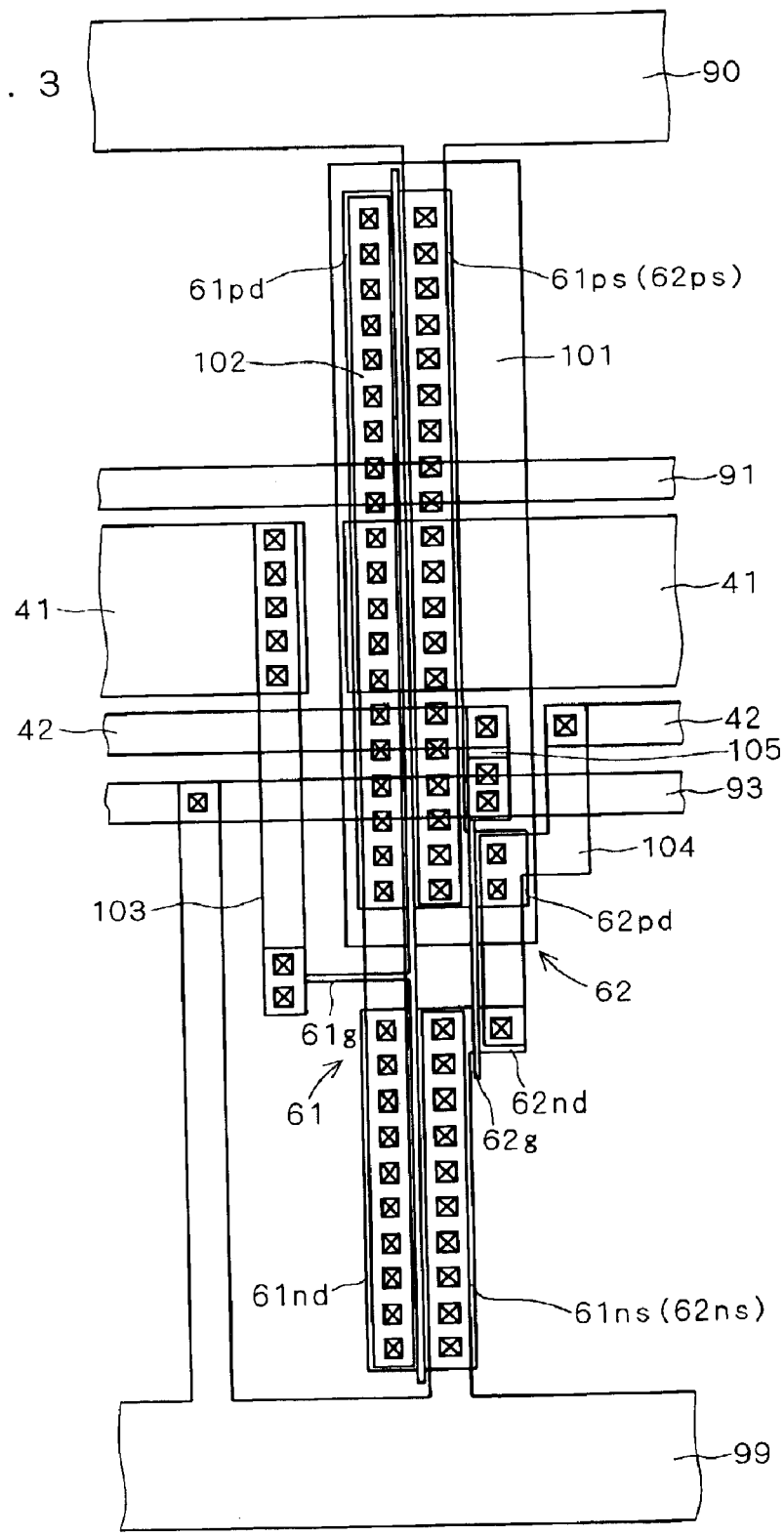
FIG. 3 is a plan view illustrating a configuration according to a first modification of the first preferred embodiment of the present invention.

FIG. 3 is a plan view schematically illustrating the configuration according to the first modification of the first preferred embodiment. The interconnection of FIG. 3 differs from the one illustrated in FIG. 2 in that a shielding line 93 is further provided as another upper interconnect. In FIG. 3, the shielding line 93 is shown to be connected to the power source line 99, so that the ground potential GND is applied to the shielding line 93 as a fixed potential. Alternatively, the shielding line 93 may be connected to the power source line 90 for receiving the positive potential VDD as a fixed potential thereof.

It is preferable to arrange the shielding line 93 on the opposite side of the control line 91 with respect to the clock transmission lines 41 and 42. That is, the clock transmission lines 41 and 42 are preferably interposed between the control line 91 and the shielding line 93. The clock transmission lines 41 and 42 are each allowed accordingly to be shielded from both sides thereof.

Figure 4:
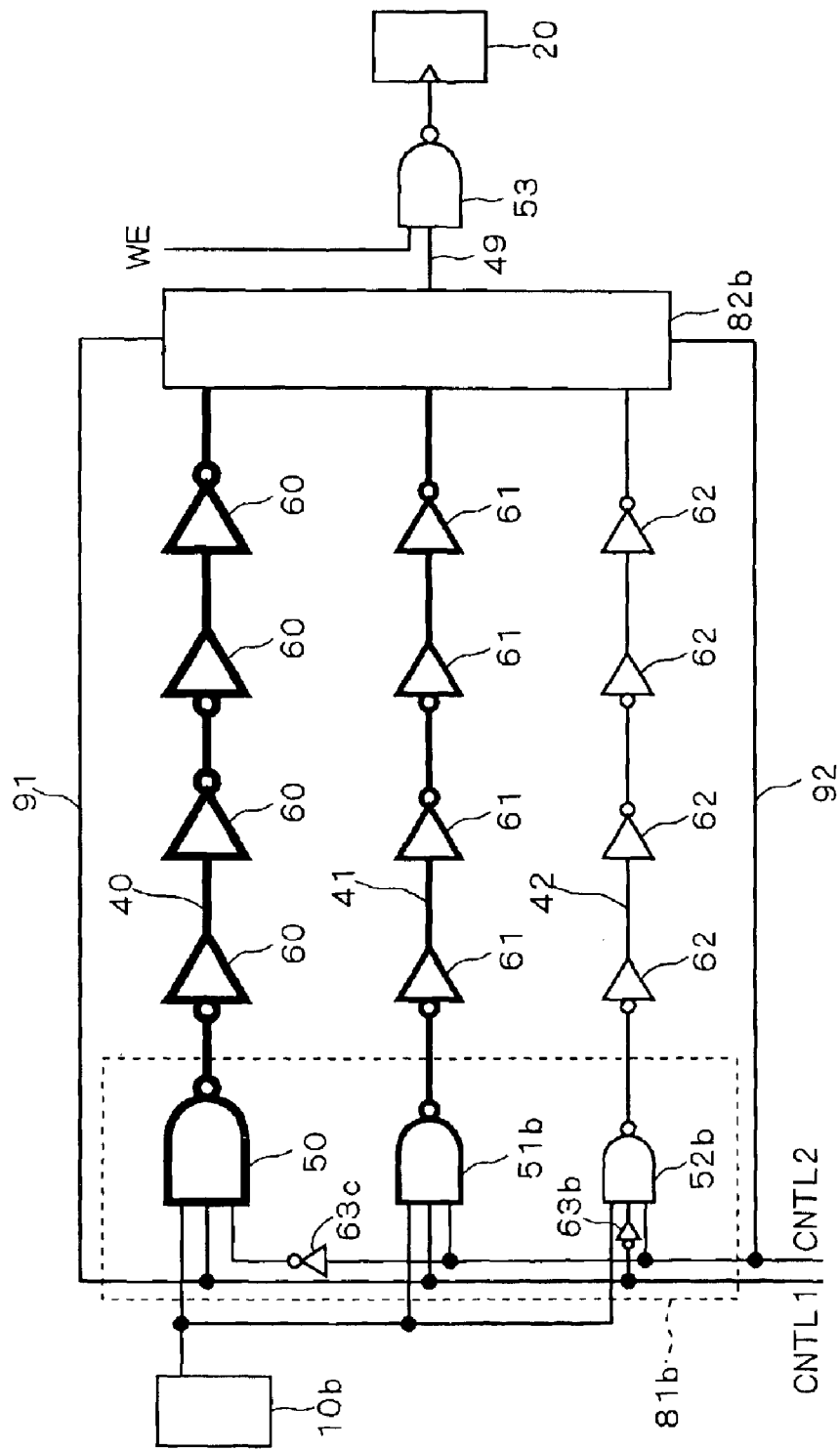
FIG. 4 is a circuit diagram according to a second modification of the first preferred embodiment of the present invention.

FIG. 4 is a circuit diagram schematically illustrating the configuration according to the second modification of the first preferred embodiment. The configuration of FIG. 4 differs from the one illustrated in FIG. 1 in that a clock generator 10b is substituted for the clock generator 10a, and selectors 81b and 82b are substituted for the selectors 81a and 82a, respectively. The clock signal transmission circuit of FIG. 4 further comprises a clock transmission line 40, and inverters 60 interposed in the clock transmission line 40 as intermediaries for transmission of a clock signal. In the clock signal transmission circuit of FIG. 4, further, a control signal CNTL2 as well as the control signal CNLT1 is provided to the selectors 81b and 82b, and a control line 92 is provided for carrying the control signal CNTL2.

In addition to the first and second clock signals, the clock generator 10 further selectively outputs a third clock signal higher in frequency than the second clock signal. In accordance with the combined logic of the control signals CNTL1 and CNTL2, it is selected which one of the first, second or the third clock signal is to be outputted from the clock generator 10b. More particularly, when the combined logic of the control signals CNTL1 and CNTL2 is "LH", the clock generator 10b outputs the first clock signal. The clock generator 10b outputs the second clock signal when the combined logic is "HH", and outputs the third clock signal when the combined logic is "HL".

The selector 81b includes logic gates 50, 51b and 52b, for example. The logic gate 50 provides the inverse of a logical product, of the output of the clock generator 10b, the control signal CNTL1, and the inverse of the control signal CNTL2, to the clock transmission line 40. The logic gate 51b provides the inverse of a logical product, of the output of the clock generator 10b, the control signal CNTL1, and the control signal CNTL2, to the clock transmission line 41. The logic gate 52b provides the inverse of a logical product, of the output of the clock generator 10b, the control signal CNTL2, and the inverse of the control signal CNTL1, to the clock transmission line 42. The selector 81b may further include an inverter 63b for outputting the inverse of the control signal CNTL1, and an inverter 63c for outputting the inverse of the control signal CNTL2.

When the first clock signal is outputted from the clock generator 10b, the first clock signal is transmitted to the clock transmission line 42, while no transmission thereof occurs to the clock transmission lines 40 and 41. When the second clock signal is outputted from the clock generator 10b, the second clock signal is transmitted to the clock transmission line 41, while no transmission thereof occurs to the clock transmission lines 40 and 42. When the third clock signal is outputted from the clock generator 10b, the third clock signal is transmitted to the clock transmission line 40, while no transmission thereof occurs to the clock transmission lines 41 and 42.

In order for the selector 81b to become operative in the foregoing manner, the logic gate 51b is preferably greater in current driving capability than the logic gate 52b, and the logic gate 50 is preferably greater in current driving capability than the logic gate 51b. Such differences in current driving capability are indicated in FIG. 4 by the thicker drawing line for the logic gate 51b than that for the logic gate 52b, and by the thicker drawing line for the logic gate 50 than that for the logic gate 51b.

In addition to the control line 91 for carrying the control signal CNTL1, the control line 92 is further provided to the selector 82b for connecting the selectors 81b and 82b to apply the control signal CNTL2. On the basis of the values of the control signals CNTL1 and CNLT2, the selector 82b outputs the clock signal, provided to any one of the clock transmission lines 40, 41 or 42, as an output clock to the clock output line 49.

When a plurality of control lines including 91 and 92 are provided, they are preferably placed to hold the clock transmission lines 40, 41 and 42 therebetween. The reason is that, except for the transient period in which the values of the control signals CNTL1 and CNTL2 are switched to change the clock signal to be outputted from the clock generator 10b, the control lines 91 and 92 bear fixed potentials. As a result, the control lines 91 and 92 can be operative to act as shielding lines for shielding the clock transmission lines 40, 41 and 42 from their surroundings.

Second Preferred Embodiment

Figure 5:
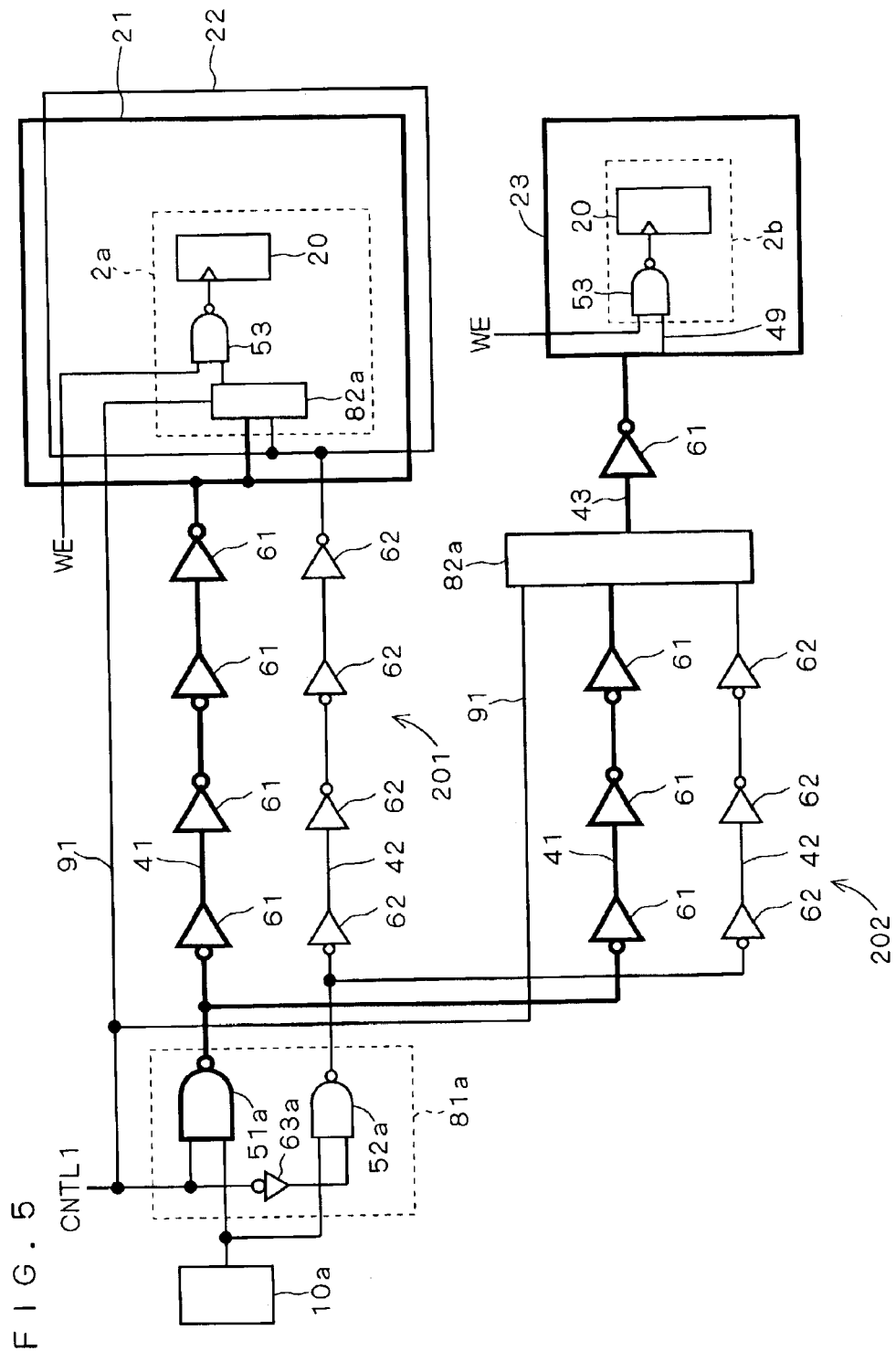
FIG. 5 is a circuit diagram illustrating a configuration according to a second preferred embodiment of the present invention.

FIG. 5 is a circuit diagram illustrating the configuration according to the second preferred embodiment of the present invention. Building blocks for distributing the first and second clock signals are added to the configuration of FIG. 1.

A first clock transmission line group 201 comprises the clock transmission line 42, the junction inverters 62 interposed in the clock transmission line 42 as intermediaries for transmission of the first clock signal, the clock transmission line 41, the junction inverters 61 interposed in the clock transmission line 41 as intermediaries for transmission of the second clock signal, and the control line 91, each of which is shown in FIG. 1. The first clock transmission line group 201 is connected to clock transmission networks 21 and 22. In FIG. 5, the details of the clock transmission networks 21 and 22 are omitted for simplification. Only the outermost shapes thereof are shown (as ring).

The clock transmission networks 22 and 21 are respectively operative to distribute the first and second clock signals to a plurality of cells. The clock transmission network 21 has a larger linewidth than that of the clock transmission network 22. Similar to FIG. 1, such difference in linewidth is also indicated in FIG. 5 by the difference in thickness of drawing lines.

In FIG. 5, only one cell to be connected both to the clock transmission networks 21 and 22 is shown as a cell 2a. Actually, more than one cell 2a is provided, which is connected both to the clock transmission networks 21 and 22.

Each cell 2a includes the selector 82a, the NAND gate 53, and the logic element 20 as described in the first preferred embodiment with reference to FIG. 1. The interconnection therebetween is the same as the one shown in FIG. 1.

The first clock transmission line group 201 carries the first and second clock signals through the clock transmission networks 22 and 21, respectively, to the plurality of cells 2a. The selector 82a is connected to the clock transmission line 42 through the clock transmission network 22, and is connected to the clock transmission line 41 through the clock transmission network 21. As described in the first preferred embodiment, depending on the logic value of the control signal CNTL1, either the clock transmission networks 21 or 22 is connected to an input terminal of the NAND gate 53.

According to the configuration in which the cell 2a is provided with the selector 82a, by arranging more than one cell 2a in each of the clock transmission networks 21 and 22, the second preferred embodiment will have the same effect as obtained in the first preferred embodiment.

A second clock transmission line group 202, as a branch of the first clock transmission line group 201, carries the first and second clock signals. More specifically, the second clock transmission line group 202 comprises clock transmission lines 41 and 42, and a control line 91 independently branching off from the clock transmission lines 41 and 42, and from the control line 91 of the first clock transmission line group 201, respectively. The second clock transmission line group 202 is connected to a clock transmission network through the selector 82a and a clock transmission line 43. In order to reverse the direction of the clock signal transition, the junction inverter 61 may be interposed in the clock transmission line 43 between the selector 82a and the clock transmission network 23, as shown in FIG. 5.

In response to the case of transmission of the second clock signal, the clock transmission line 43 preferably has a large linewidth approximately the same as that of the clock transmission line 41.

The clock signal transmission network 23 is operative to distribute either the first or the second clock signal to a plurality of cells. In FIG. 5, the detail of the clock transmission network 23 is omitted for simplification. Only the outermost shape thereof is shown (as ring). Further, only one cell to be connected to the clock transmission network 23 is shown as a cell 2b. Actually, more than one cell 2b is provided, which is connected to the clock transmission network 23.

The cell 2b includes the NAND gate 53 and the logic element 20 as described in the first preferred embodiment with reference to FIG. 1. The interconnection therebetween is the same as the one shown in FIG. 1.

Either the first or the second clock signal is transmitted to each one of the cells 2b, passing through the selector 82a, the clock transmission line 43, and the clock transmission network 23 in this order. When the plurality of cells 2b provided in the clock transmission network 23 each become operative only by the first clock signal or by the second clock signal, the selector 82a can be arranged outside the clock transmission network 23. It is thus allowed to reduce the size of the cell 2b, and eventually, reduce the size of the clock transmission network 23. With respect to the second clock transmission line group 202 and the selector 82a, the second preferred embodiment will naturally have the same effect as obtained in the first preferred embodiment.

Resulting from the small size of the clock transmission network 23, the linewidth of the clock output line 49, connecting the clock transmission network 23 and the cell 2b inside the network 23, is not required to be as large as the clock transmission line 43 in linewidth.

As described so far, the mechanism for transmitting a clock signal is applicable to a semiconductor device such as a logic circuit including at least either more than one logic cell 2a, or more than one logic cell 2b.

While the invention has been shown and described in detail, the foregoing description is in all aspects illustrative and not restrictive. It is therefore understood that numerous modifications and variations can be devised without departing from the scope of the invention.

What is claimed is:

1. A clock signal transmission circuit selectively receiving a first clock signal and a second clock signal, said first clock signal having a first frequency and said second clock signal having a second frequency higher than said first frequency, said clock signal transmission circuit comprising:
   a first clock transmission line for carrying said first clock signal; and
   a second clock transmission line for carrying said second clock signal, said second clock transmission line being greater in linewidth than said first clock transmission line, wherein
   no transmission of said second clock signal occurs through said first clock transmission line, and
   no transmission of said first clock signal occurs through said second clock transmission line.

2. The clock signal transmission circuit according to claim 1, wherein
   said second clock transmission line bears a fixed potential when said first clock signal passes through said first clock transmission line, and
   said first clock transmission line bears a fixed potential when said second clock signal passes through said second clock transmission line.

3. The clock signal transmission circuit according to claim 2, further receiving a control signal, first logic and second logic different from said first logic entering said control signal, said clock signal transmission circuit further comprising a first selector, applying,
   said first clock signal to one end of said first clock transmission line only when said control signal is at said first logic,
   a first fixed potential to one end of said first clock transmission line when said control signal is at logic other than said first logic,
   said second clock signal to one end of said second clock transmission line only when said control signal is at said second logic,
   a second fixed potential to one end of said second clock transmission line when said control signal is at logic other than said second logic.

4. The clock signal transmission circuit according to claim 3, further comprising a second selector, connecting
   said first clock transmission line to the outside of said second selector when said control signal is at said first logic, and
   said second clock transmission line to the outside of said second selector when said control signal is at said second logic.

5. The clock signal transmission circuit according to claim 4, further comprising a control line for carrying said control signal, wherein
   said control line and said first clock transmission line hold said second clock transmission line therebetween, or said control line and said second clock transmission line hold said first clock transmission line therebetween.

6. The clock signal transmission circuit according to claim 5, further comprising a shielding line bearing a fixed potential, said shielding line and said control line holding said first clock transmission line and said second clock transmission line therebetween.

7. The clock signal transmission circuit according to claim 4, further receiving a third clock signal having a third frequency higher than said second frequency, wherein
   said first clock signal, said second clock signal, and said third clock signal are selectively applied,
   third logic different from said first logic and said second logic further enters said control signal,
   said clock signal transmission circuit further comprises:
   a third clock transmission line for carrying said third clock signal, said third clock transmission line being greater in linewidth than said second clock transmission line; and
   a plurality of control lines for carrying said control signal in combination,
   said first selector applies said third clock signal to one end of said third clock transmission line only when said control signal is at said third logic, said first selector further applying a third fixed potential to one end of said third clock transmission line when said control signal is at logic other than said third logic,
   said second selector connects said third clock transmission line to the outside of said second selector when said control signal is at said third logic, and
   said plurality of control lines hold therebetween said first clock transmission line, said second clock transmission line, and said third clock transmission line.

8. The clock signal transmission circuit according to claim 1, further comprising:
   a first buffer interposed in said first clock transmission line as an intermediary for transmission of said first clock signal; and
   a second buffer interposed in said second clock transmission line as an intermediary for transmission of said second clock signal, said second buffer having a greater current driving capability than that of said first buffer.

9. The clock signal transmission circuit according to claim 3, further comprising:
   a first clock transmission network for carrying said first clock signal; and
   a second clock transmission network for carrying said second clock signal, wherein
   a plurality of cells each including a second selector are provided both in said first clock transmission network and in said second clock transmission network,
   said second selectors are each connected to said first clock transmission line and to said second clock transmission line through said first clock transmission network and through said second clock transmission network, respectively, and
   said second selectors each connect said first clock transmission network to the outside of said second selector when said control signal is at said first logic, said second selector further connecting said second clock transmission network to the outside of said second selector when said control signal is at said second logic.

10. The clock signal transmission circuit according to claim 4, further comprising:
a clock transmission network for carrying one of said first clock signal and said second clock signal, wherein
a plurality of cells are provided in said clock transmission network, and
one of said first clock signal and said second clock signal is transmitted to said plurality of cells, passing through said second selector and said clock transmission network in this order.

* * * * *